(12) United States Patent
Yamazaki

(10) Patent No.: US 11,109,491 B2
(45) Date of Patent: Aug. 31, 2021

(54) WIRING SUBSTRATE AND METHOD OF MANUFACTURING THE WIRING SUBSTRATE

(71) Applicant: Seiko Epson Corporation, Tokyo (JP)

(72) Inventor: Yutaka Yamazaki, Shiojiri (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/526,072

(22) Filed: Jul. 30, 2019

(65) Prior Publication Data

US 2020/0045834 A1 Feb. 6, 2020

(30) Foreign Application Priority Data

Jul. 31, 2018 (JP) .............................. JP2018-143270

(51) Int. Cl.
| | |
|---|---|
| *B32B 3/00* | (2006.01) |
| *H05K 3/38* | (2006.01) |
| *H05K 3/18* | (2006.01) |
| *C23C 18/30* | (2006.01) |
| *C23C 18/50* | (2006.01) |
| *C23C 18/20* | (2006.01) |
| *H05K 1/03* | (2006.01) |
| *B32B 15/04* | (2006.01) |

(52) U.S. Cl.
CPC ............ *H05K 3/381* (2013.01); *B32B 15/04* (2013.01); *C23C 18/204* (2013.01); *C23C 18/30* (2013.01); *C23C 18/50* (2013.01); *H05K 1/03* (2013.01); *H05K 3/184* (2013.01); *H05K 2203/072* (2013.01); *H05K 2203/107* (2013.01); *H05K 2203/1105* (2013.01); *Y10T 428/24917* (2015.01)

(58) Field of Classification Search
None
See application file for complete search history.

(56) References Cited

U.S. PATENT DOCUMENTS

| | | | | |
|---|---|---|---|---|
| 4,113,899 | A * | 9/1978 | Henry | H05K 1/0373 427/290 |
| 4,643,798 | A * | 2/1987 | Takada | C23C 18/22 216/20 |
| 5,702,584 | A * | 12/1997 | Goenka | B29C 37/0082 205/158 |
| 6,812,299 | B2 * | 11/2004 | Sato | C08F 283/10 257/E23.077 |
| 9,797,043 | B1 * | 10/2017 | Chan | C23C 18/1641 |
| 2004/0018131 | A1 * | 1/2004 | Izumida | C08K 5/0025 423/22 |
| 2011/0139494 | A1 * | 6/2011 | Yu | H05K 3/107 174/255 |

(Continued)

FOREIGN PATENT DOCUMENTS

JP 2006222408 A * 8/2006
JP 2012-136769 A 7/2012

*Primary Examiner* — Seth Dumbris

(74) *Attorney, Agent, or Firm* — Harness, Dickey & Pierce, P.L.C.

(57) ABSTRACT

A wiring substrate includes a substrate containing a resin as a main component and including a mixed layer in which the resin and a catalyst are mixed together; and a metal wire disposed to cover the mixed layer and being in contact with the catalyst. The wiring substrate with such a configuration can increase the adhesion of the metal wire to the substrate.

2 Claims, 7 Drawing Sheets

(56) References Cited

U.S. PATENT DOCUMENTS

| | | | | |
|---|---|---|---|---|
| 2013/0321988 A1* | 12/2013 | Ho | ................ | H05K 13/00 |
| | | | | 361/679.01 |
| 2014/0178571 A1* | 6/2014 | Bamba | ................ | C23C 18/2086 |
| | | | | 427/97.3 |
| 2020/0008306 A1* | 1/2020 | Karavakis | ................ | H05K 3/182 |

* cited by examiner

WIRING SUBSTRATE AND METHOD OF MANUFACTURING THE WIRING SUBSTRATE

The present application is based on, and claims priority from, JP Application Serial Number 2018-143270, filed Jul. 31, 2018, the disclosure of which is hereby incorporated by reference herein in its entirety.

BACKGROUND

1. Technical Field

The present disclosure relates to a wiring substrate and a method of manufacturing the wiring substrate.

2. Related Art

Various wiring substrates have been used. A metal wire, which is a wire made of a metal, is formed at such a wiring substrate.

For example, JP-A-2012-136769 discloses a method of manufacturing a molded circuit component which is a wiring substrate, the method including irradiating a base body made of a synthetic resin and serving as a substrate with a laser beam to modify its surface, and bringing an ion catalyst into contact with the surface modified portion to provide electroless plating at the portion, thereby forming a metal wire.

The method of manufacturing the molded circuit component disclosed in JP-A-2012-136769 irradiates the synthetic resin base body with a laser beam to modify its surface, and brings the ion catalyst into contact with the surface modified portion. However, the surface modification by bringing the ion catalyst into contact with the surface modified portion and applying the ion catalyst thereto merely put the ion catalyst on the surface of the synthetic resin base body. The metal wire formed by electroless plating may not have sufficient adhesion to the base body.

SUMMARY

To address the above-described problems, according to an aspect of the disclosure, a wiring substrate includes a substrate containing a resin as a main component and including a mixed layer in which the resin and a catalyst are mixed together; and a metal wire disposed to cover the mixed layer and being in contact with the catalyst.

DESCRIPTION OF EXEMPLARY EMBODIMENTS

Figure 1:
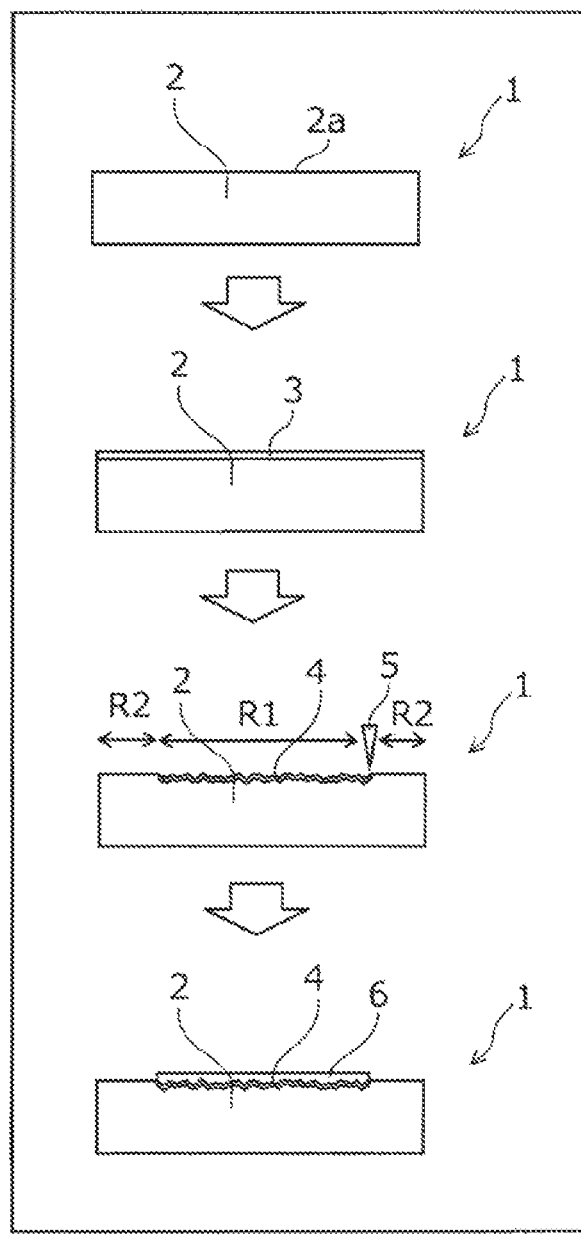
FIG. 1 is a schematic diagram for explaining a wiring substrate and a method of manufacturing the wiring substrate according to a first embodiment of the disclosure.

First, the disclosure will be briefly described.

To address the above-described problems, according to a first aspect of the disclosure, a wiring substrate includes a substrate containing a resin as a main component and including a mixed layer in which the resin and a catalyst are mixed together; and a metal wire disposed to cover the mixed layer and being in contact with the catalyst.

With this aspect, the metal wire is in contact with the catalyst. In other words, for example, when the metal wire is formed by metal plating, a metal plating layer serving as the metal wire is disposed at a position at which the metal plating layer is in contact with the mixed layer in which the resin and the catalyst are mixed together, and the metal plating layer covers the mixed layer. That is, since the resin and the catalyst are mixed together in the mixed layer, metal plating is provided by using the catalyst in the state covered with the resin and embedded in the resin of the substrate. Thus, metal plating is provided by using not just the catalyst applied to the one surface of the substrate, but additionally the catalyst in the state embedded in the resin of the substrate, thereby increasing the adhesion of the metal wire to the substrate.

In this case, "the catalyst" represents a catalyst for performing a precipitation reaction of the metal when the metal plating layer is formed.

In the wiring substrate according to a second aspect of the disclosure, based on the first aspect, an insulating material is disposed at a metal-wire non-formation portion of one surface of the substrate where the metal wire is not formed.

With this aspect, since the insulating material is disposed at the metal-wire non-formation portion of the one surface of the substrate, an electrical leak between metal wires can be suppressed.

According to a third aspect of the disclosure, a method of manufacturing a wiring substrate includes a catalyst application step of applying a catalyst to one surface of a substrate containing a resin as a main component; a first laser irradiation step of irradiating the substrate with a laser beam via the catalyst; and a metal plating step of providing metal plating in a laser irradiation region in the first laser irradiation step.

With this aspect, by irradiating the substrate with the laser beam via the catalyst, the resin and the catalyst are mixed together to form the mixed layer with its surface modified, and metal plating is provided in the laser irradiation region serving as the mixed layer. That is, since the resin and the catalyst are mixed together, metal plating is provided by using the catalyst in the state covered with the resin and embedded in the resin of the substrate. Thus, metal plating is provided by using not just the catalyst applied to the one surface of the substrate, but additionally the catalyst in the state embedded in the resin of the substrate, thereby increasing the adhesion of the metal wire to the substrate.

The method of manufacturing the wiring substrate according to a fourth aspect of the disclosure, based on the third aspect, further includes an insulating material application step of applying an insulating material to the one surface of the substrate; and a second laser irradiation step of irradiating the substrate with a laser beam via the insulating material. The insulating material application step and the second laser irradiation step are performed before the catalyst application step. The catalyst application step applies the catalyst to a region including a laser irradiation region in the second laser irradiation step. The first laser irradiation step irradiates the laser irradiation region in the second laser irradiation step with the laser beam.

With this aspect, the insulating material is applied to the one surface of the substrate, the substrate applied with the insulating material is irradiated with the laser beam via the insulating material, and metal plating is provided at the irradiation position of the laser beam. That is, the insulating material is disposed at a metal-plating non-formation portion of the one surface of the substrate where metal plating is not provided. Thus, occurrence of leak current at a non-formation portion of a metal plating layer can be suppressed.

In the method of manufacturing the wiring substrate according to a fifth aspect of the disclosure, based on any one of the third and fourth aspects, the first laser irradiation step includes a diffusion step of diffusing the catalyst in the resin, and an ablation step of ablating the resin.

With the aspect, since the catalyst is diffused in the resin and the resin is ablated in the first laser irradiation step, the catalyst can be disposed to appear from the one surface of the substrate while being embedded in the resin of the substrate. Accordingly, the adhesion of the metal wire to the substrate can be increased.

According to a sixth aspect of the disclosure, a method of manufacturing a wiring substrate includes a surface layer formation step of forming, at one surface of a substrate containing a resin as a main component, a surface layer in which a catalyst and the resin are mixed together; a third laser irradiation step for the surface layer of irradiating the surface layer with a laser beam; and a metal plating step of providing metal plating in a laser irradiation region in the third laser irradiation step.

With this aspect, the surface layer in which the catalyst and the resin are mixed together is formed at the surface of the substrate containing the resin as the main component, and the surface layer is irradiated with the laser beam. That is, by modifying the surface of the surface layer in which the resin and the catalyst are mixed together using the laser beam, metal plating is provided using the catalyst in the state embedded in the resin of the substrate. Thus, metal plating is provided by using not just the catalyst applied to the one surface of the substrate, but additionally the catalyst in the state embedded in the resin of the substrate, thereby increasing the adhesion of the metal wire to the substrate.

A wiring substrate and a method of manufacturing the wiring substrate according to embodiments of the disclosure are described below in detail with reference to the accompanying drawings.

Figure 2:
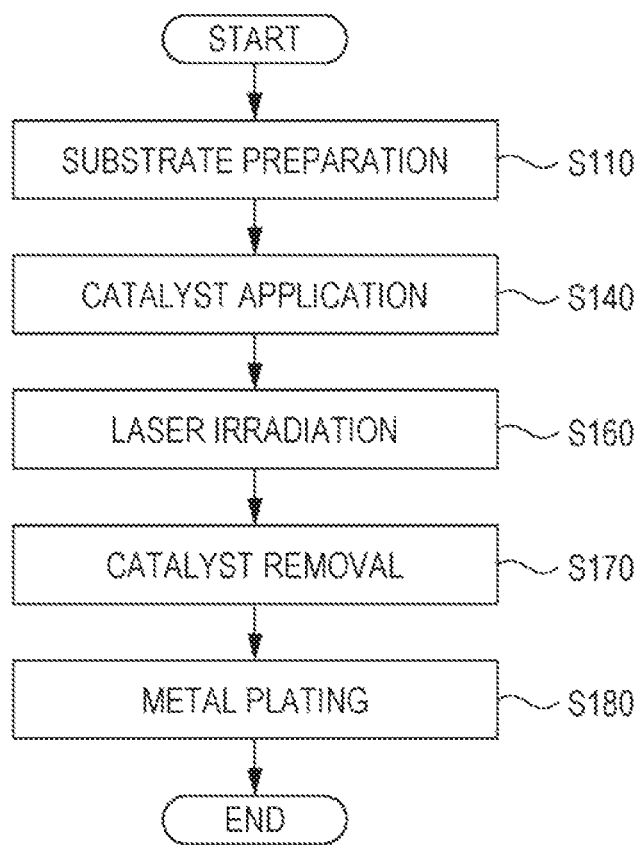
FIG. 2 is a flow chart of the method of manufacturing the wiring substrate according to the first embodiment of the disclosure.
Figure 3:
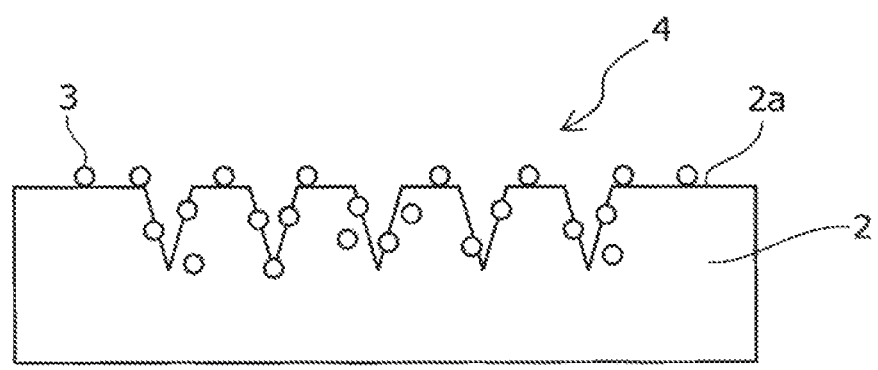
FIG. 3 is a schematic diagram of the wiring substrate indicating a state after a laser irradiation step in a manufacturing process of the wiring substrate according to the first embodiment of the disclosure.

First Embodiment, FIG. 1 to FIG. 3

A wiring substrate 1 and a method of manufacturing the wiring substrate 1 according to a first embodiment of the disclosure are described with reference to FIGS. 1 to 3. FIG. 1 illustrates a manufacturing process of the wiring substrate 1 from the top sub-figure indicating a manufacturing start state of the wiring substrate 1 to the bottom sub-figure indicating a completed state thereof. The wiring substrate 1 in this embodiment is a wiring substrate at which a metal wire is formed. For example, copper may be suitably used as the metal used for the metal wire; however, the metal is not limited to copper.

First, manufacturing of the wiring substrate 1 in this embodiment is started by preparing a substrate 2 containing a resin as a main component as illustrated in the top sub-figure in FIG. 1. Describing in the viewpoint of the method of manufacturing the wiring substrate 1 in this embodiment, this step corresponds to a substrate preparation step indicated in step S110 in FIG. 2. The substrate 2 can be formed by using, for example, a 3D printer; however, the method of forming the substrate 2 is not particularly limited.

Next, for the wiring substrate 1 in the state illustrated in the top sub-figure in FIG. 1, a catalyst 3 is applied to a surface 2a serving as one surface of the substrate 2 as illustrated in the second sub-figure from the top of FIG. 1. Describing in the viewpoint of the method of manufacturing the wiring substrate 1 in this embodiment, this step corresponds to a catalyst application step indicated in step S140 in FIG. 2. As the catalyst 3, for example, palladium ions may be used. When copper is used as the metal used for the metal wire, palladium ions have an excellent advantageous effect of the catalyst 3, and hence palladium ions can be suitably used as the catalyst 3; however, the catalyst 3 is not limited to palladium ions. The method of applying the catalyst 3 to the surface 2a of the substrate 2 can be performed by applying an aqueous solution or the like containing the catalyst 3 to the surface 2a of the substrate 2 by coating, or immersing the substrate 2 in an aqueous solution or the like containing the catalyst 3; however, is not particularly limited thereto.

Next, for the wiring substrate 1 in the state illustrated in the second sub-figure from the top of FIG. 1, a laser irradiation region R1, as a metal-wire formation portion which is a portion of the surface 2a of a catalyst application substrate serving as the substrate 2 applied with the catalyst 3, is irradiated with a laser beam 5. By the irradiation with the laser beam 5, the surface 2a at the metal-wire formation portion is roughened and modified, and the resin constituting the substrate 2 and the catalyst 3 are mixed to define a mixed layer 4. That is, the metal-wire formation portion is formed with unevenness at the surface 2a and the catalyst 3 is in the state embedded in the resin of the substrate 2. Describing in the viewpoint of the method of manufacturing the wiring substrate 1 in this embodiment, this step corresponds to a first laser irradiation step indicated in step S160 in FIG. 2.

Then, a catalyst removal step indicated in step S170 in FIG. 2 is performed. By performing the catalyst removal step, the catalyst 3 adhering to a laser non-irradiation region R2 corresponding to a metal-wire non-formation portion is removed, and turns into a state illustrated in the third sub-figure from the top of FIG. 1 where the substrate 2 is flat rather than roughened and does not include any catalyst 3. In this case, the catalyst removal step can perform, for example, washing with pure water; however, the method of removing the catalyst 3 is not particularly limited as far as the catalyst 3 adhering to the laser non-irradiation region R2 can be removed. When the amount of adhesion of the catalyst 3 to the laser non-irradiation region R2 is small, the catalyst removal step can be omitted.

Then, for the wiring substrate 1 in the state illustrated in the third sub-figure from the top of FIG. 1, metal plating constituting a metal wire is provided in the laser irradiation region R1 as the metal-wire formation portion to form a metal plating layer 6 as illustrated in the bottom sub-figure in FIG. 1. In other words, the metal plating layer 6 is disposed at a position at which the metal plating layer 6 is in contact with the mixed layer 4 and covers the mixed layer 4. Describing in the viewpoint of the method of manufacturing the wiring substrate 1 in this embodiment, this step corresponds to a metal plating step indicated in step S180 in FIG. 2. Although there is no particular limitation on the specific method of forming the metal plating layer 6 serving as the metal wire, electroless plating may be suitably performed, and for example, a method of immersing the wiring substrate 1 in an aqueous solution or the like containing the metal ions constituting the metal wire may be performed. Specifically, for example, when the metal constituting the metal wire is a copper-nickel alloy, the wiring substrate 1 in the state illustrated in the third sub-figure from the top of FIG. 1 is immersed in an electroless copper-nickel plating solution, and the copper-nickel alloy is precipitated by using, as a core, palladium serving as the catalyst 3.

In short, regarding the wiring substrate 1 of this embodiment illustrated in the bottom sub-figure in FIG. 1, the substrate 2 containing the resin as the main component includes the mixed layer 4 in which the resin and the catalyst 3 are mixed together. The metal plating layer 6 constituting the metal wire is disposed to cover the mixed layer 4 and is in contact with the catalyst 3. In other words, the wiring substrate 1 of this embodiment is the wiring substrate at which the metal wire is formed, and includes the substrate 2 containing the resin as the main component. In addition, the wiring substrate 1 includes the mixed layer 4 that is provided at the metal-wire formation portion at the surface 2a of the substrate 2 and in which the resin of the substrate 2 and the catalyst 3 are mixed together. Further, the wiring substrate 1 includes the metal plating layer 6 constituting the metal wire, and is disposed at the position at which the metal plating layer 6 is in contact with the mixed layer 4 and covers the mixed layer 4.

In the wiring substrate 1 of this embodiment illustrated in the bottom sub-figure in FIG. 1, the metal plating layer 6 serving as the metal wire is disposed at the position at which the metal plating layer 6 is in contact with the mixed layer 4 in which the resin of the substrate 2 and the catalyst 3 are mixed together, and the metal plating layer 6 covers the mixed layer 4. That is, since the resin of the substrate 2 and the catalyst 3 are mixed together in the mixed layer 4, metal plating is provided by using the catalyst 3 in the state covered with the resin and embedded in the resin of the substrate 2. Thus, metal plating is provided by using not just the catalyst 3 applied to the surface 2a of the substrate 2, but additionally the catalyst in the state embedded in the resin of the substrate 2, thereby increasing the adhesion of the metal wire to the substrate 2.

In the viewpoint of the method of manufacturing the wiring substrate 1 of this embodiment, the method of manufacturing the wiring substrate 1 of this embodiment includes the catalyst application step in step S140 of applying the catalyst 3 to the surface 2a of the substrate 2 containing the resin as the main component; the first laser irradiation step in step S160 of irradiating, with the laser beam 5, the portion of the surface 2a of the substrate 2 applied with the catalyst 3; the catalyst removal step in step S170 of removing, among the catalyst 3 applied to the substrate 2 in the catalyst application step, the catalyst 3 in the laser non-irradiation region R2 in the first laser irradiation step; and the metal plating step in step S180 of providing metal plating in the laser irradiation region R1 in the first laser application step.

In the method of manufacturing the wiring substrate in this embodiment, by irradiating a portion of the surface 2a of the substrate 2 applied with the catalyst 3 with the laser beam 5 via the catalyst 3, the resin of the substrate 2 and the catalyst 3 are mixed together, the mixed layer 4 with its surface modified is formed, and metal plating is provided in the laser irradiation region R1 serving as the mixed layer 4. That is, since the resin of the substrate 2 and the catalyst 3 are mixed together, metal plating is provided by using the catalyst 3 in the state covered with the resin and embedded in the resin of the substrate 2. Thus, by performing the method of manufacturing the wiring substrate 1 of this embodiment, metal plating is provided by using not just the catalyst 3 applied to the surface 2a of the substrate 2, but additionally the catalyst 3 in the state embedded in the resin of the substrate 2, thereby increasing the adhesion of the metal wire to the substrate 2.

Figure 8:
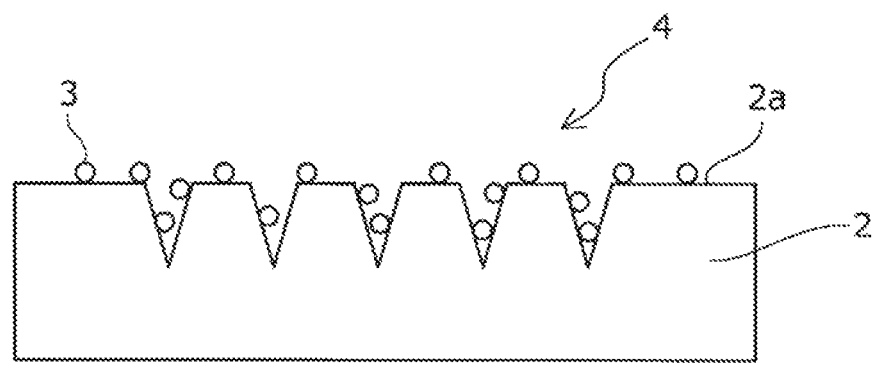
FIG. 8 is a schematic diagram of a wiring substrate indicating a state after a laser irradiation step in a manufacturing process of a wiring substrate according to a comparative example.

In this way, since the resin of the substrate 2 and the catalyst 3 are mixed together, metal plating is provided by using the catalyst 3 in the state covered with the resin and embedded in the resin of the substrate 2. That is, a portion of the catalyst 3 is embedded in the resin and fixed to the resin as illustrated in FIG. 3. The portion of the catalyst 3 embedded in the resin and fixed to the resin is joined to and comes into close contact with the metal constituting the metal wire in the metal plating step. Thus, the adhesion of metal plating to the substrate 2 significantly increases. In contrast, as illustrated in FIG. 8, as far as the catalyst 3 is merely put on the surface 2a of the substrate 2, the adhesion of metal plating to the substrate 2 does not increase.

In addition, in the first laser irradiation step in step S160, by irradiating the laser irradiation region R1 with the laser beam 5, the surface 2a is roughened and modified at the mixed layer 4, and the resin constituting the substrate 2 and the catalyst 3 are mixed together. That is, the first laser irradiation step includes a diffusion step of diffusing the catalyst 3 in the resin of the substrate 2. Moreover, in the first laser irradiation step, the resin of the substrate 2 is ablated by the irradiation with the laser beam 5 by the irradiation with the laser beam 5, and hence includes an ablation step.

In this way, with the method of manufacturing the wiring substrate 1 in this embodiment, since the catalyst 3 is diffused in the resin and the resin is ablated in the first laser irradiation step, the catalyst 3 can be disposed to appear from the surface 2a of the substrate 2 while being embedded in the resin of the substrate 2. Thus, by performing the method of manufacturing the wiring substrate 1 of this embodiment, the adhesion of the metal wire to the substrate 2 can be increased.

Figure 4:
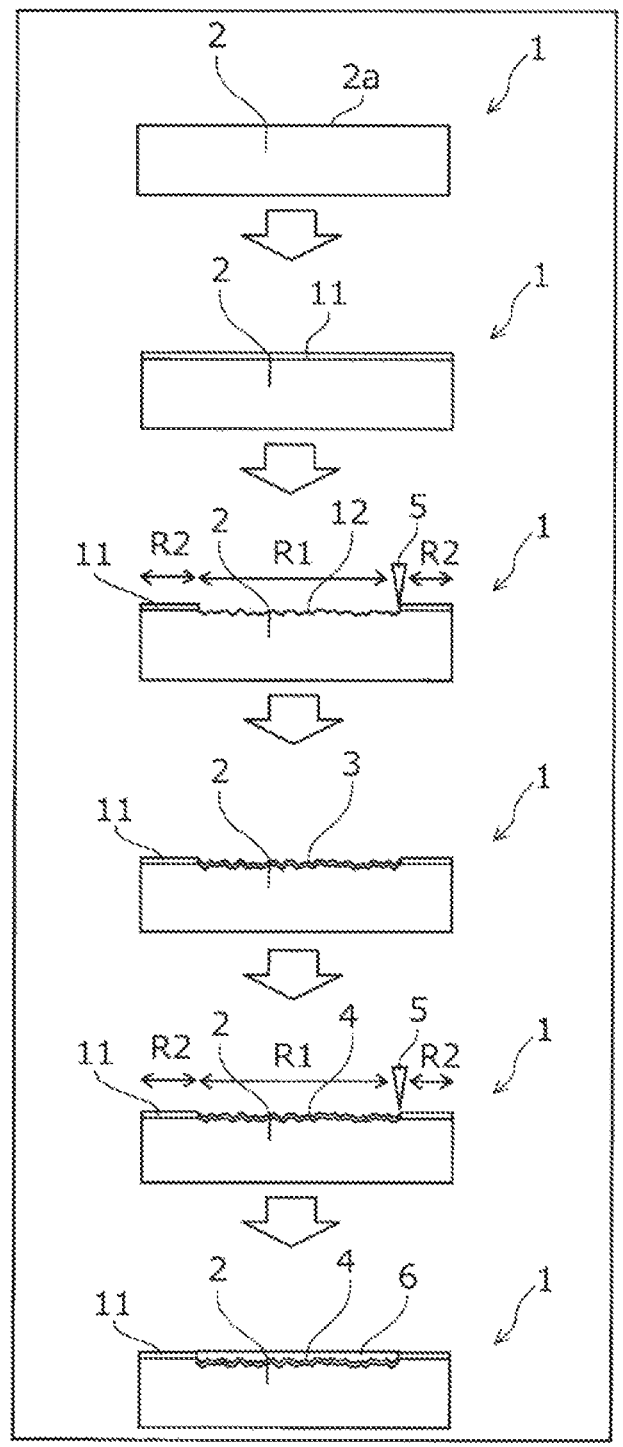
FIG. 4 is a schematic diagram for explaining a wiring substrate and a method of manufacturing the wiring substrate according to a second embodiment of the disclosure.
Figure 5:
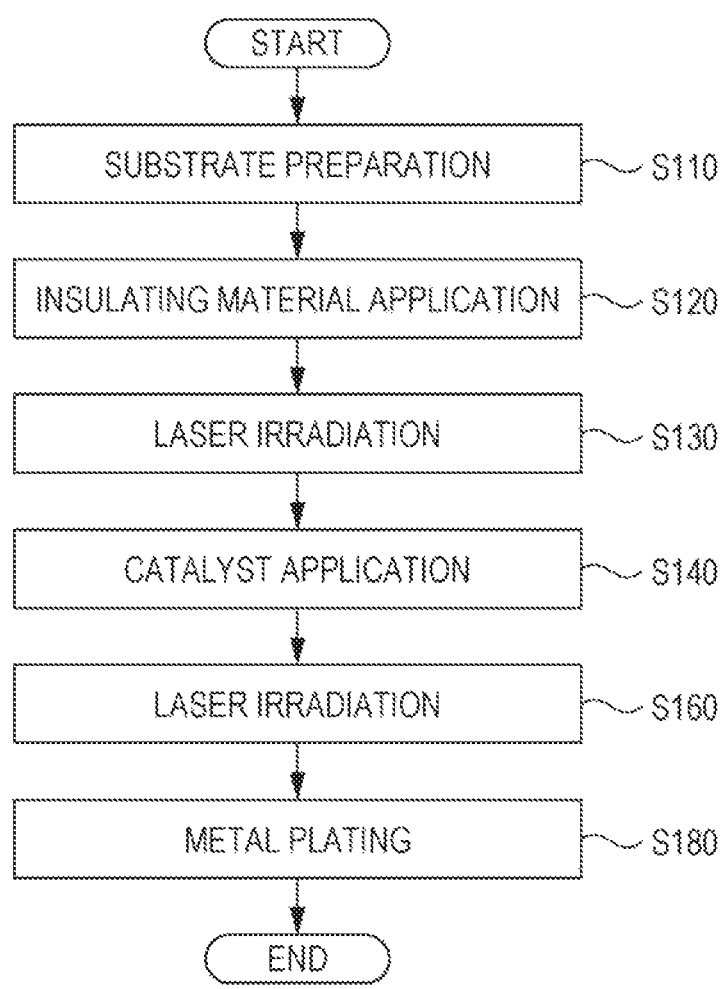
FIG. 5 is a flow chart of the method of manufacturing the wiring substrate according to the second embodiment of the disclosure.

Second Embodiment, FIG. 4 and FIG. 5

Next, a wiring substrate 1 and a method of manufacturing the wiring substrate 1 according to a second embodiment of the disclosure are described with reference to FIGS. 4 and 5. The wiring substrate 1 in this embodiment is a wiring substrate at which a metal wire is formed similarly to the wiring substrate 1 of the first embodiment. For example, copper may be suitably used as the metal used for the metal wire; however, the metal is not limited to copper.

FIG. 4 is a diagram corresponding to FIG. 1 of the wiring substrate 1 according to the first embodiment, and FIG. 5 is a diagram corresponding to FIG. 2 of the method of manufacturing the wiring substrate 1 according to the first embodiment. Components common to those in the first embodiment are denoted by the same reference numerals, and the detailed description thereof will be omitted.

First, manufacturing of the wiring substrate 1 in this embodiment is started by preparing a substrate 2 containing a resin as a main component as illustrated in the top sub-figure in FIG. 4, similarly to the wiring substrate 1 of the first embodiment. Describing in the viewpoint of the method of manufacturing the wiring substrate 1 in this embodiment, this step corresponds to a substrate preparation step indicated in step S110 in FIG. 5.

Next, for the wiring substrate 1 in the state illustrated in the top sub-figure in FIG. 4, a water-repellent insulating material 11 is applied to a surface 2a of the substrate 2 as illustrated in the second sub-figure from the top of FIG. 4. The application of the insulating material 11 has an effect of masking a metal-wire non-formation portion so as not to be provided with metal plating. Describing in the viewpoint of the method of manufacturing the wiring substrate 1 in this embodiment, this step corresponds to an insulating material application step indicated in step S120 in FIG. 5. In this case, the insulating material 11 can suitably use, for example, an insulating and water-repellent fluoride compound. However, the insulating material 11 is not limited to the fluoride compound or not limited to the water-repellent material. The method of applying the insulating material 11 to the surface 2a of the substrate 2 can be performed by applying the insulating material 11 to the surface 2a of the substrate 2 by coating; however, the method is not particularly limited.

Next, for the wiring substrate 1 in the state illustrated in the second sub-figure from the top of FIG. 4, a laser irradiation region R1, as a metal-wire formation portion which is a portion of the surface 2a of an insulating material application substrate serving as the substrate 2 applied with the insulating material 11, is irradiated with a laser beam 5 as illustrated in the third sub-figure from the top of FIG. 4. In this case, by the irradiation with the laser beam 5, the surface 2a at the removal portion 12 of the insulating material 11 as the metal-wire formation portion is roughened and modified. Describing in the viewpoint of the method of manufacturing the wiring substrate 1 in this embodiment, this step corresponds to a second laser irradiation step indicated in step S130 in FIG. 5.

Next, for the wiring substrate 1 in the state illustrated in the third sub-figure from the top of FIG. 4, a catalyst 3 is applied to the surface 2a of the substrate 2 as illustrated in the fourth sub-figure from the top of FIG. 4. Describing in the viewpoint of the method of manufacturing the wiring substrate 1 in this embodiment, this step corresponds to a catalyst application step indicated in step S140 in FIG. 5. Note that step S140 in FIG. 5 is similar to step S140 in FIG. 2.

Next, for the wiring substrate 1 in the state illustrated in the fourth sub-figure from the top of FIG. 4, a laser irradiation region R1, as a metal-wire formation portion which is a portion of the surface 2a of a catalyst application substrate serving as the substrate 2 applied with the catalyst 3, is irradiated with a laser beam 5 as illustrated in the fifth sub-figure from the top of FIG. 4. Describing in the viewpoint of the method of manufacturing the wiring substrate 1 in this embodiment, this step corresponds to a first laser irradiation step indicated in step S160 in FIG. 5. Note that step S160 in FIG. 5 is similar to step S160 in FIG. 2.

In the method of manufacturing the wiring substrate in FIG. 5 in this embodiment, since the water-repellent material is used for the insulating material 11, almost no catalyst 3 remains in a laser non-irradiation region R2 at the surface 2a of the substrate 2. Thus, a catalyst removal step as indicated in step S170 in FIG. 2 is not performed. However, when a material without water repellency is used as the insulating material 11, the catalyst removal step as indicated in step S170 in FIG. 2 may be performed after step S160 in FIG. 5.

Then, a metal plating layer 6 is formed at the wiring substrate 1 in the state illustrated in the fifth sub-figure from the top of FIG. 4, by providing metal plating constituting a metal wire in the laser irradiation region R1 as the metal-wire formation portion as illustrated in the bottom sub-figure in FIG. 4. Describing in the viewpoint of the method of manufacturing the wiring substrate 1 in this embodiment, this step corresponds to a metal plating step indicated in step S180 in FIG. 5. Note that step S180 in FIG. 5 is similar to step S180 in FIG. 2.

The wiring substrate 1 in this embodiment illustrated in the bottom sub-figure in FIG. 4 has the insulating material 11 disposed at a non-formation portion of the metal plating layer 6, that is, a metal-wire non-formation portion of the surface 2a of the substrate 2. Thus, the wiring substrate 1 in this embodiment can suppress an electrical leak between metal wires.

In the viewpoint of the method of manufacturing the wiring substrate 1 of this embodiment, the method of manufacturing the wiring substrate 1 of this embodiment includes the insulating material application step in step S120 of applying the insulating material 11 to the surface 2a of the substrate 2, and the second laser irradiation step in step S130 of irradiating a portion of the surface 2a of the substrate 2 applied with the insulating material 11 with the laser beam 5. The insulating material application step and the second laser irradiation step are performed before the catalyst application step in step S140. In the catalyst application step, as illustrated in the fourth sub-figure from the top of FIG. 4, the catalyst 3 is applied to a region including the laser irradiation region R1 in the second laser irradiation step. In addition, in the first laser irradiation step, the laser irradiation region R1 is irradiated with the laser beam 5 in the second laser irradiation step as illustrated in the fifth sub-figure from the top of FIG. 4.

With the method of manufacturing the wiring substrate 1 of this embodiment, the insulating material 11 is applied to the surface 2a of the substrate 2, the portion of the surface 2a of the substrate 2 applied with the insulating material 11 is irradiated with the laser beam 5 via the insulating material 11, and metal plating is provided at the irradiation position of the laser beam 5. That is, as illustrated in the bottom sub-figure in FIG. 4, the insulating material 11 is disposed at a metal-plating non-formation portion of the surface 2a of the substrate 2 where metal plating is not provided. By performing the method of manufacturing the wiring substrate 1 according to this embodiment, occurrence of leak current at the non-formation portion of the metal plating layer 6 can be suppressed.

In addition, with the method of manufacturing the wiring substrate 1 according to this embodiment, similarly to the method of manufacturing the wiring substrate 1 according to the first embodiment, in the first laser irradiation step in step S160, by irradiating the laser irradiation region R1 with the laser beam 5, the surface 2a is roughened and modified at the mixed layer 4, and the resin constituting the substrate 2 and the catalyst 3 are mixed together. That is, the first laser irradiation step includes a diffusion step of diffusing the catalyst 3 into the resin of the substrate 2 and an ablation step of ablating the resin of the substrate 2 by the irradiation with the laser beam 5.

Figure 6:
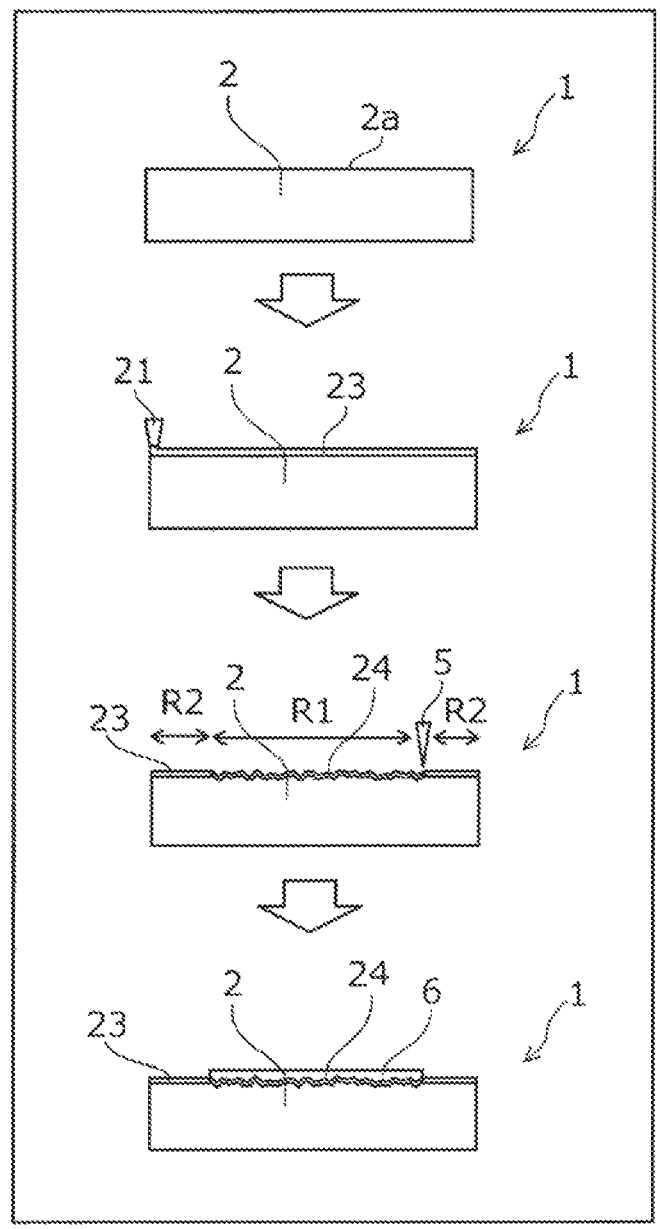
FIG. 6 is a schematic diagram for explaining a wiring substrate and a method of manufacturing the wiring substrate according to a third embodiment of the disclosure.
Figure 7:
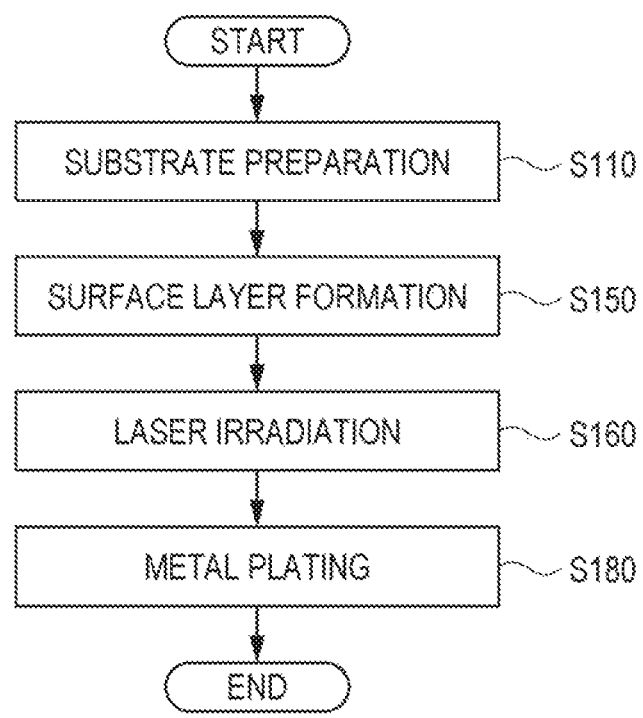
FIG. 7 is a flow chart of the method of manufacturing the wiring substrate according to the third embodiment of the disclosure.

Third Embodiment, FIG. 6 and FIG. 7

Next, a wiring substrate 1 and a method of manufacturing the wiring substrate 1 according to a third embodiment of the disclosure are described with reference to FIGS. 6 and 7. The wiring substrate 1 in this embodiment is a wiring substrate at which a metal wire is formed similarly to the wiring substrate 1 of any one of the first and second embodiments. For example, copper may be suitably used as the metal used for the metal wire; however, the metal is not limited to copper.

FIG. 6 is a diagram corresponding to FIG. 1 of the wiring substrate 1 according to the first embodiment, and FIG. 7 is a diagram corresponding to FIG. 2 of the method of manufacturing the wiring substrate 1 according to the first embodiment. Components common to those in the first and second embodiments are denoted by the same reference numerals, and the detailed description thereof will be omitted.

First, manufacturing of the wiring substrate 1 in this embodiment is started by preparing a substrate 2 containing a resin as a main component as illustrated in the top sub-figure in FIG. 6, similarly to the wiring substrate 1 of the first embodiment. Describing in the viewpoint of the method of manufacturing the wiring substrate 1 in this embodiment, this step corresponds to a substrate preparation step indicated in step S110 in FIG. 7.

Next, for the wiring substrate 1 in the state illustrated in the top sub-figure in FIG. 6, a surface layer 23 is formed using a material in which a catalyst 3 and a resin constituting the substrate 2 are mixed together, at a surface 2a of the substrate 2 by using a surface layer forming unit 21 as illustrated in the second sub-figure from the top of FIG. 6. In this case, the forming material of the surface layer 23 is not particularly limited as far as the forming material contains the catalyst 3 and the resin constituting the substrate 2. Describing in the viewpoint of the method of manufacturing the wiring substrate 1 in this embodiment, this step corresponds to a surface layer formation step indicated in step S150 in FIG. 7.

Next, for the wiring substrate 1 in the state illustrated in the second sub-figure from the top of FIG. 6, a laser irradiation region R1, as a surface modification portion 24 which is a metal-wire formation portion and a portion of the surface 2a of a catalyst application substrate serving as the substrate 2 applied with the catalyst 3, is irradiated with a laser beam 5 as illustrated in the third sub-figure from the top of FIG. 6. Describing in the viewpoint of the method of manufacturing the wiring substrate 1 in this embodiment, this step corresponds to a first laser irradiation step indicated in step S160 in FIG. 7. Note that step S160 in FIG. 7 is similar to step S160 in FIG. 2.

Then, for the wiring substrate 1 in the state illustrated in the third sub-figure from the top of FIG. 6, a metal plating layer 6 is formed, by providing metal plating constituting a metal wire in the laser irradiation region R1 as the metal-wire formation portion as illustrated in the bottom sub-figure in FIG. 6. Describing in the viewpoint of the method of manufacturing the wiring substrate 1 in this embodiment, this step corresponds to a metal plating step indicated in step S180 in FIG. 7. Note that step S180 in FIG. 7 is similar to step S180 in FIG. 2.

As described above, the method of manufacturing the wiring substrate 1 according to this embodiment includes the surface layer formation step in step S150 of forming the surface layer 23 in which the catalyst 3 and the resin are mixed together at the surface 2a of the substrate 2 containing the resin as the main component; a third laser irradiation step in step S160 for the surface layer 23 of irradiating a portion of the surface layer 23 with the laser beam 5; and the metal plating step in step S180 of providing metal plating in the laser irradiation region R1 in the third laser irradiation step.

With the method of manufacturing the wiring substrate 1 according to this embodiment, the surface layer 23 in which the catalyst 3 and the resin are mixed together is formed at the surface 2a of the substrate 2 containing the resin as the main component, and the portion of the surface layer 23 is irradiated with the laser beam 5. That is, as illustrated in the bottom sub-figure in FIG. 6, by modifying the surface of the surface layer 23 in which the resin and the catalyst 3 are mixed together with the laser beam 5, metal plating is provided using the catalyst in the state embedded in the resin of the substrate 2. Thus, by performing the method of manufacturing the wiring substrate 1 of this embodiment, metal plating is provided by using not just the catalyst 3 applied to the surface 2a of the substrate 2, but additionally the catalyst 3 in the state embedded in the resin of the substrate 2, thereby increasing the adhesion of the metal wire to the substrate 2.

While the surface layer 23 according to this embodiment is formed by applying the material in which the catalyst 3 and the resin constituting the substrate 2 are mixed together to the surface 2a of the substrate 2, for example, the surface layer 23 may be a skin layer obtained when the substrate 2 is formed by injection molding. That is, the method of forming the surface layer 23 is not particularly limited.

It is to be understood that the disclosure is not limited to the above-described embodiments, and various modifications may be made within the scope of the disclosure described in the claims, and that they are included within the scope of the disclosure.

What is claimed is:

1. A wiring substrate including a substrate containing a resin as a main component, comprising:
    a flat part where a surface of the substrate is flat;
    an irradiated resin part, the irradiated resin part being a location of the substrate where the resin of the substrate has unevenness after the resin has been irradiated; and
    a metal wire provided on and corresponding to the location where the resin has unevenness,
    wherein the irradiated resin part is provided with a mixed layer in which the resin and catalyst particles are mixed together, the mixed layer being embedded with the catalyst particles covered by the resin of the substrate,
    the catalyst particles are not provided in the flat part of the substrate, and
    the metal wire is provided on and corresponds to the mixed layer, the metal layer being provided in contact with the resin and the catalyst particles.

2. The wiring substrate according to claim 1, wherein an insulating material is disposed at a metal-wire non-formation portion of one surface of the substrate where the metal wire is not formed.

* * * * *